(12) United States Patent
Lazar et al.

(10) Patent No.: US 10,542,361 B1
(45) Date of Patent: Jan. 21, 2020

(54) NONLINEAR CONTROL OF LOUDSPEAKER SYSTEMS WITH CURRENT SOURCE AMPLIFIER

(71) Applicant: Samsung Electronics Co., Ltd., Suwon-si (KR)

(72) Inventors: James F. Lazar, Moorpark, CA (US); Pascal M. Brunet, Pasadena, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/057,711

(22) Filed: Aug. 7, 2018

(51) Int. Cl.
*H04R 29/00* (2006.01)
*H04R 3/04* (2006.01)
*H04R 9/06* (2006.01)
*H03F 3/183* (2006.01)

(52) U.S. Cl.
CPC ............. *H04R 29/001* (2013.01); *H04R 3/04* (2013.01); *H04R 9/06* (2013.01); *H03F 3/183* (2013.01); *H03F 2200/03* (2013.01)

(58) Field of Classification Search
CPC .......... H04R 29/001; H04R 3/04; H04R 9/06; H03F 2200/03; H03F 3/183
USPC ......................................................... 381/59
See application file for complete search history.

(56) References Cited

U.S. PATENT DOCUMENTS

| | | |
|---|---|---|
| 5,870,484 A | 2/1999 | Greenberger et al. |
| 6,059,926 A | 5/2000 | Hiroshima |
| 6,275,592 B1 | 8/2001 | Vartiainen |
| 7,024,014 B1 | 4/2006 | Noll |
| 7,348,908 B2 | 3/2008 | Slavin |

(Continued)

FOREIGN PATENT DOCUMENTS

| | | |
|---|---|---|
| EP | 1799013 B1 | 2/2010 |
| EP | 2642769 A1 | 9/2013 |

(Continued)

OTHER PUBLICATIONS

Thomsen, S. et. al., "Design and Analysis of a Flatness-Based Control Approach for Speed Control of Drive Systems with Elastic Couplings and Uncertain Loads," Proceedings of the 2011-14th European Conference (EPE 2011), Aug. 30-Sep. 1, 2011, pp. 1-10, IEEE Press, United States.

(Continued)

*Primary Examiner* — Paul Kim
(74) *Attorney, Agent, or Firm* — Sherman IP LLP; Kenneth L. Sherman; Hemavathy Perumal

(57) ABSTRACT

One embodiment provides a system for nonlinear control of a loudspeaker. The system comprises a current source amplifier connected to the loudspeaker, and a controller connected to the current source amplifier. The controller is configured to determine a target displacement of a diaphragm of the speaker driver based on a source signal for reproduction via the loudspeaker, determine a control current based on the target displacement of the diaphragm and a first physical model of the loudspeaker, and transmit a control current signal specifying the control current to the current source amplifier. The current source amplifier outputs the control current to drive the speaker driver based on the control current signal. An actual displacement of the diaphragm during the reproduction of the source signal is controlled based on the control current, via the control current signal.

20 Claims, 16 Drawing Sheets

(56) References Cited

U.S. PATENT DOCUMENTS

| | | | |
|---|---|---|---|
| 7,359,519 B2 | 4/2008 | Lee et al. | |
| 7,372,966 B2 | 5/2008 | Bright | |
| 7,688,984 B2 | 3/2010 | De Callafon | |
| 8,073,149 B2 | 12/2011 | Kuze | |
| 8,086,956 B2 | 12/2011 | Su et al. | |
| 8,146,989 B2 | 4/2012 | Godiska et al. | |
| 8,204,210 B2 | 6/2012 | van de Laar et al. | |
| 8,300,837 B2 | 10/2012 | Shmunk | |
| 8,391,498 B2 | 3/2013 | Potard | |
| 8,538,040 B2 | 9/2013 | Kirn | |
| 8,577,047 B2 | 11/2013 | Gautama | |
| 8,855,322 B2 | 10/2014 | Ryu et al. | |
| 9,042,561 B2 | 5/2015 | Gautama et al. | |
| 9,130,527 B2 | 9/2015 | Potard | |
| 9,154,101 B2 | 10/2015 | Dhuyvetter | |
| 9,161,126 B2 | 10/2015 | Su et al. | |
| 9,374,634 B2 | 6/2016 | Macours et al. | |
| 9,432,771 B2 | 8/2016 | Oyetunji et al. | |
| 9,553,554 B2 | 1/2017 | Kimura et al. | |
| 9,578,416 B2 | 2/2017 | Gautama et al. | |
| 9,635,454 B2 | 4/2017 | Larrien | |
| 9,661,428 B2 | 5/2017 | Holladay et al. | |
| 9,837,971 B2 | 12/2017 | Luo et al. | |
| 9,883,305 B2 | 1/2018 | Risberg et al. | |
| 9,900,690 B2 * | 2/2018 | Risberg | H04R 3/002 |
| 9,980,068 B2 | 5/2018 | Berthelsen et al. | |
| 9,992,571 B2 | 6/2018 | Hu | |
| 10,219,090 B2 | 2/2019 | Adams et al. | |
| 2002/0141098 A1 | 10/2002 | Schlager | |
| 2004/0028242 A1 | 2/2004 | Kitamura | |
| 2005/0122166 A1 | 6/2005 | Premakanthan et al. | |
| 2006/0274904 A1 | 12/2006 | Lashkari | |
| 2007/0098190 A1 | 5/2007 | Song et al. | |
| 2009/0180636 A1 | 7/2009 | Su et al. | |
| 2012/0203526 A1 | 8/2012 | Bai et al. | |
| 2012/0289809 A1 | 11/2012 | Kaib et al. | |
| 2013/0094657 A1 | 4/2013 | Brammer et al. | |
| 2014/0051483 A1 | 2/2014 | Schoerkmaier | |
| 2014/0254827 A1 | 9/2014 | Bailey et al. | |
| 2014/0286500 A1 | 9/2014 | Iwamoto et al. | |
| 2015/0010171 A1 | 1/2015 | Pernici et al. | |
| 2015/0281844 A1 | 10/2015 | Stabile | |
| 2015/0319529 A1 | 11/2015 | Klippel et al. | |
| 2016/0134982 A1 | 5/2016 | Iyer | |
| 2016/0360331 A1 | 12/2016 | Yeh | |
| 2016/0373858 A1 | 12/2016 | Lawrence et al. | |
| 2017/0006394 A1 * | 1/2017 | Risberg | H04R 3/002 |
| 2017/0188150 A1 * | 6/2017 | Brunet | H04R 3/08 |
| 2017/0272045 A1 | 9/2017 | Chadha | |
| 2017/0280240 A1 | 9/2017 | Hu et al. | |
| 2017/0318388 A1 | 11/2017 | Risberg et al. | |
| 2018/0014120 A1 | 1/2018 | Lawrence et al. | |
| 2018/0034430 A1 | 2/2018 | Ahmed et al. | |
| 2018/0192192 A1 | 7/2018 | Brunet et al. | |
| 2019/0222939 A1 | 7/2019 | Brunet et al. | |
| 2019/0281385 A1 | 9/2019 | Brunet et al. | |

FOREIGN PATENT DOCUMENTS

| | | | |
|---|---|---|---|
| EP | 3079375 A1 | 10/2016 | |
| JP | 3433342 B2 | 8/2003 | |
| JP | 2005129977 A | 5/2005 | |
| JP | 2007060648 A | 3/2007 | |
| JP | 2007081815 A | 3/2007 | |
| JP | 2004312141 A | 4/2015 | |
| JP | 2015082754 A | 4/2015 | |
| JP | 2015084499 A | 4/2015 | |
| JP | 6182869 B2 | 8/2017 | |
| KR | 10-20050023841 A | 3/2005 | |
| KR | 10-20140097874 A | 8/2014 | |
| KR | 101445186 B1 | 10/2014 | |
| WO | 2013182901 A1 | 12/2013 | |
| WO | 2014045123 A | 3/2014 | |
| WO | 2015143127 A | 9/2015 | |
| WO | 2015191691 A1 | 12/2015 | |

OTHER PUBLICATIONS

Fliess, M. et al., "Flatness and Defect of Nonlinear Systems: Introductory Theory and Examples", International Journal of Control, Jun. 1995, pp. 1327-1361, vol. 61, Taylor & Francis, United Kingdom.

Papazoglou, N. et al., "Linearisation par Asservissement d'unhaut-parleur electrodynamique: approche par les Systemes Hamiltoniens a Ports", Memoire De Fin D Etude M2R SAR Parcourt ATIAM, pp. 1-52, Aug. 11, 2014.

International Search Report and Written Opinion dated Mar. 31, 2017 for International Application PCT/KR2016/015435 from Korean Intellectual Property Office, pp. 1-12, Republic of Korea.

International Search Report and Written Opinion dated Apr. 20, 2018 for International Application PCT/KR2018/000016 from Korean Intellectual Property Office, pp. 1-5, Republic of Korea.

U.S. Non-Final Office Action for U.S. Appl. No. 15/835,245 dated Jun. 14, 2018.

Extended European Search Report dated Jul. 23, 2018 for European Application No. 16882101.5 from European Patent Office, pp. 1-8, Munich, Germany.

Hu, Y. et al., "Effects of the Cone and Edge on the Acoustic Characteristics of a Cone Loudspeaker", Advances in Acoustics and Vibration, May 21, 2017, pp. 1-12, vol. 2017, Hindawi, Japan.

U.S. Final Office Action for U.S. Appl. No. 15/835,245 dated Jan. 10, 2019.

U.S. Non-Final Office Action for U.S. Appl. No. 15/391,633 dated Mar. 28, 2019.

U.S. Advisory Action for U.S. Appl. No. 15/835,245 dated Apr. 11, 2019.

International Search Report and Written Opinion dated Apr. 29, 2019 for International Application PCT/KR2019/000702 from Korean Intellectual Property Office, pp. 1-10, Republic of Korea.

U.S.Notice of Allowance for U.S. Appl. No. 15/835,245 dated May 6, 2019.

International Search Report and Written Opinion dated May 7, 2019 for International Application PCT/KR2019/001090 from Korean Intellectual Property Office, pp. 1-13, Republic of Korea.

U.S. Supplemental Notice of Allowability for U.S. Appl. No. 15/835,245 dated Jul. 15, 2019.

U.S. Notice of Allowance for U.S. Appl. No. 15/873,530 dated Jul. 18, 2019.

International Search Report dated Jun. 21, 2019 for International Application PCT/KR2019/002741 from Korean Intellectual Property Office, pp. 1-3, Republic of Korea.

U.S. Supplemental Notice of Allowability for U.S. Appl. No. 15/835,245 dated Aug. 28, 2019.

U.S. Notice of Allowability for U.S. Appl. No. 15/873,530 dated Aug. 28, 2019.

U.S. Notice of Allowability for U.S. Appl. No. 15/873,530 dated Sep. 9, 2019.

U.S. Non-Final Action for U.S. Appl. No. 16/224,604 dated Oct. 22, 2019.

U.S. Notice of Allowance for U.S. Appl. No. 15/391,633 dated Sep. 18, 2019.

* cited by examiner

NONLINEAR CONTROL OF LOUDSPEAKER SYSTEMS WITH CURRENT SOURCE AMPLIFIER

TECHNICAL FIELD

One or more embodiments relate generally to loudspeakers, and in particular, a method and system for nonlinear control of loudspeaker systems with current source amplifier.

BACKGROUND

A loudspeaker produces sound when connected to an integrated amplifier, a television (TV) set, a radio, a music player, an electronic sound producing device (e.g., a smartphone, a computer), a video player, etc.

SUMMARY

One embodiment provides a system for nonlinear control of a loudspeaker. The system comprises a current source amplifier connected to the loudspeaker, and a controller connected to the current source amplifier. The controller is configured to determine a target displacement of a diaphragm of a speaker driver of the loudspeaker based on a source signal for reproduction via the loudspeaker, determine a control current based on the target displacement of the diaphragm and a first physical model of the loudspeaker, and transmit a control current signal specifying the control current to the current source amplifier. The current source amplifier outputs the control current to drive the speaker driver based on the control current signal. An actual displacement of the diaphragm during the reproduction of the source signal is controlled based on the control current, via the control current signal.

Another embodiment provides a method for nonlinear control of a loudspeaker. The method comprises determining a target displacement of a diaphragm of a speaker driver of the loudspeaker based on a source signal for reproduction via the loudspeaker. The method further comprises determining a control current based on the target displacement of the diaphragm and a physical model of the loudspeaker, and transmitting a control current signal specifying the control current to a current source amplifier connected to the loudspeaker. The current source amplifier outputs the control current to drive the speaker driver based on the control current signal. An actual displacement of the diaphragm during the reproduction of the source signal is controlled based on the control current, via the control current signal.

One embodiment provides a loudspeaker device comprising a speaker driver including a diaphragm, a current source amplifier connected to the speaker driver, and a controller connected to the current source amplifier. The controller is configured to determine a target displacement of a diaphragm of the speaker driver based on a source signal for reproduction via the loudspeaker device, determine a control current based on the target displacement of the diaphragm and a physical model of the loudspeaker device, and transmit a control current signal specifying the control current to the current source amplifier. The current source amplifier outputs the control current to drive the speaker driver based on the control current signal. An actual displacement of the diaphragm during the reproduction of the source signal is controlled based on the control current, via the control current signal.

These and other features, aspects and advantages of the one or more embodiments will become understood with reference to the following description, appended claims, and accompanying figures.

DETAILED DESCRIPTION

Figure 1:
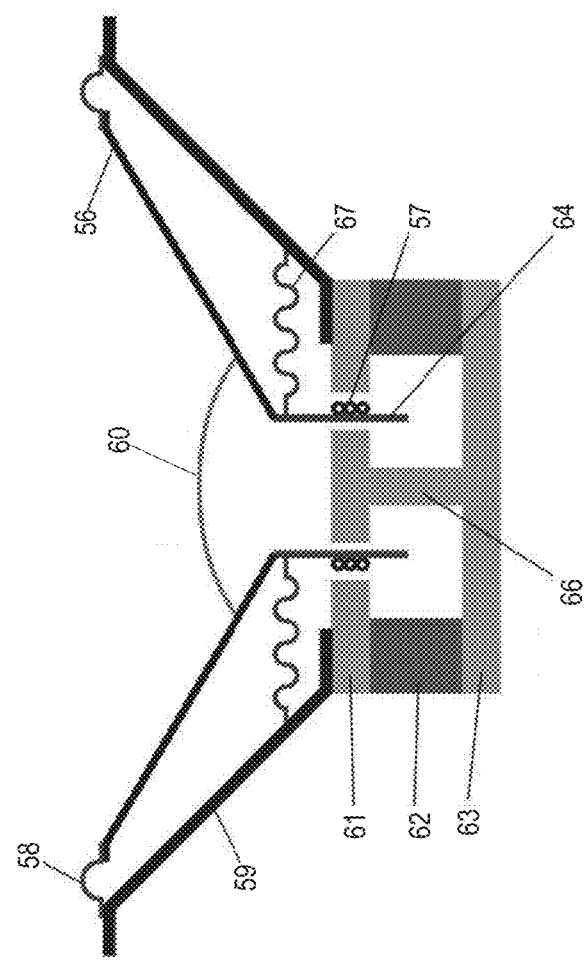
FIG. 1 illustrates a cross section of an example speaker driver.

The following description is made for the purpose of illustrating the general principles of one or more embodiments and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

One or more embodiments relate generally to loudspeakers, and in particular, a method and system for nonlinear control of loudspeaker systems with current source amplifier. One embodiment provides a system for nonlinear control of a loudspeaker. The system comprises a current source amplifier connected to the loudspeaker, and a controller connected to the current source amplifier. The controller is configured to determine a target displacement of a diaphragm of a speaker driver of the loudspeaker based on a source signal for reproduction via the loudspeaker, determine a control current based on the target displacement of the diaphragm and a first physical model of the loudspeaker, and transmit a control current signal specifying the control current to the current source amplifier. The current source amplifier outputs the control current to drive the speaker driver based on the control current signal. An actual displacement of the diaphragm during the reproduction of the source signal is controlled based on the control current, via the control current signal.

Another embodiment provides a method for nonlinear control of a loudspeaker. The method comprises determining a target displacement of a diaphragm of a speaker driver of the loudspeaker based on a source signal for reproduction via the loudspeaker. The method further comprises determining a control current based on the target displacement of the diaphragm and a physical model of the loudspeaker, and transmitting a control current signal specifying the control current to a current source amplifier connected to the loudspeaker. The current source amplifier outputs the control current to drive the speaker driver based the control current signal. An actual displacement of the diaphragm during the reproduction of the source signal is controlled based on the control current, via the control current signal.

One embodiment provides a loudspeaker device comprising a speaker driver including a diaphragm, a current source amplifier connected to the speaker driver, and a controller connected to the current source amplifier. The controller is configured to determine a target displacement of a diaphragm of the speaker driver based on a source signal for reproduction via the loudspeaker device, determine a control current based on the target displacement of the diaphragm and a physical model of the loudspeaker device, and transmit a control current signal specifying the control current to the current source amplifier. The current source amplifier outputs the control current to drive the speaker driver based on the control current signal. An actual displacement of the diaphragm during the reproduction of the source signal is controlled based on the control current, via the control current signal.

For expository purposes, the terms "loudspeaker", "loudspeaker device" and "loudspeaker system" may be used interchangeably in this specification.

For expository purposes, the terms "displacement" and "excursion" may be used interchangeably in this specification.

A conventional loudspeaker is nonlinear by design and produces harmonics, intermodulation components, and modulation noise. Nonlinear audio distortion (i.e., audible distortion) impairs sound quality of audio produced by the loudspeaker (e.g., audio quality and speech intelligibility). In recent times, industrial design constraints often require loudspeaker systems to be smaller-sized for portability and compactness. Such design constraints, however, trade size and portability for sound quality, resulting in increased audio distortion. As such, an anti-distortion system for reducing/removing audio distortion is needed, in particular for obtaining a more pronounced/bigger bass sound from smaller-sized loudspeaker systems.

A loudspeaker device includes at least one speaker driver for reproducing sound. FIG. 1 illustrates a cross section of an example speaker driver 55. The speaker driver 55 comprises one or more moving components, such as a diaphragm 56 (e.g., a cone-shaped diaphragm), a driver voice coil 57, a former 64, and a protective cap 60 (e.g., a dome-shaped dust cap). The speaker driver 55 further comprises one or more of the following components: (1) a surround roll 58 (e.g., suspension roll), (2) a basket 59, (3) a top plate 61, (4) a magnet 62, (5) a bottom plate 63, (6) a pole piece 66, and (7) a spider 67.

Figure 2:
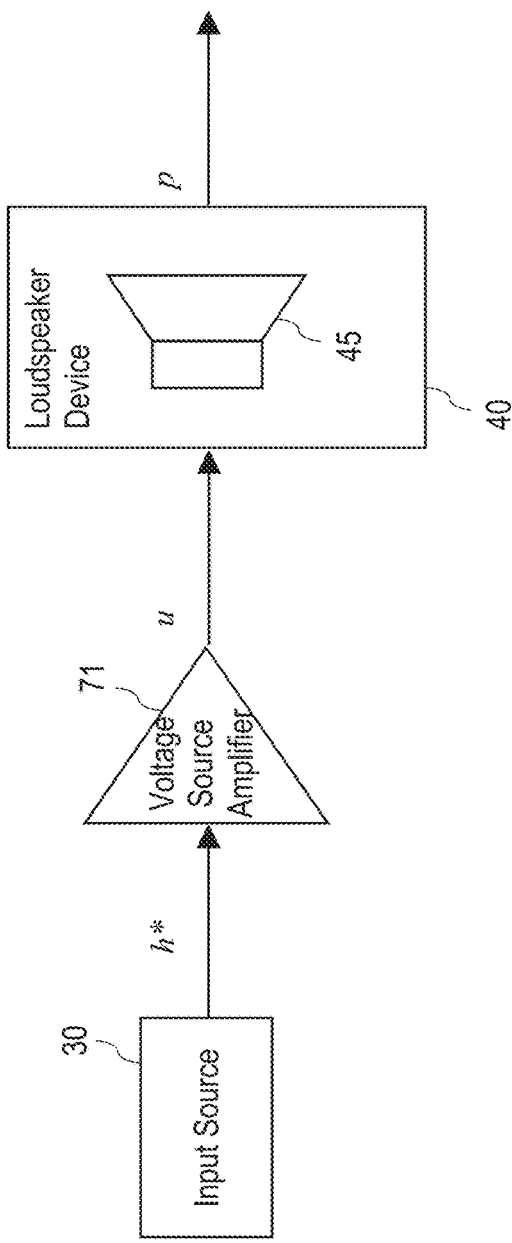
FIG. 2 illustrates an example loudspeaker device driven by a voltage source amplifier.

Conventionally, a loudspeaker device is driven by a voltage source amplifier. FIG. 2 illustrates an example loudspeaker device 40 driven by a voltage source amplifier 71. The loudspeaker device 40 includes a speaker driver 45 for reproducing sound. The loudspeaker device 40 may be any type of loudspeaker device such as, but not limited to, a sealed-box loudspeaker, a vented-box loudspeaker, a passive radiator loudspeaker, a loudspeaker array, etc. The speaker driver 45 may be any type of speaker driver such as, but not limited to, a forward-facing speaker driver, an upward-facing speaker driver, a downward-facing speaker driver, etc. The speaker driver 55 in FIG. 1 is an example implementation of the speaker driver 45. The speaker driver 45 comprises one or more moving components, such as a diaphragm 56 (FIG. 1) and a driver voice coil 57 (FIG. 1).

The voltage source amplifier 71 is connected to the loudspeaker device 40. An input source 30 provides the voltage source amplifier 71 a source signal (e.g., an input audio signal) for audio reproduction. Let h* generally denote an input voltage of the source signal. The voltage source amplifier 71 is configured to apply a voltage u to the speaker driver 45, amplifying the source signal for reproduction via the loudspeaker device 40. The speaker driver 45 is driven by applied voltage u from the voltage source amplifier 71. The loudspeaker device 40 produces a sound wave with an actual sound pressure p.

Figure 3:
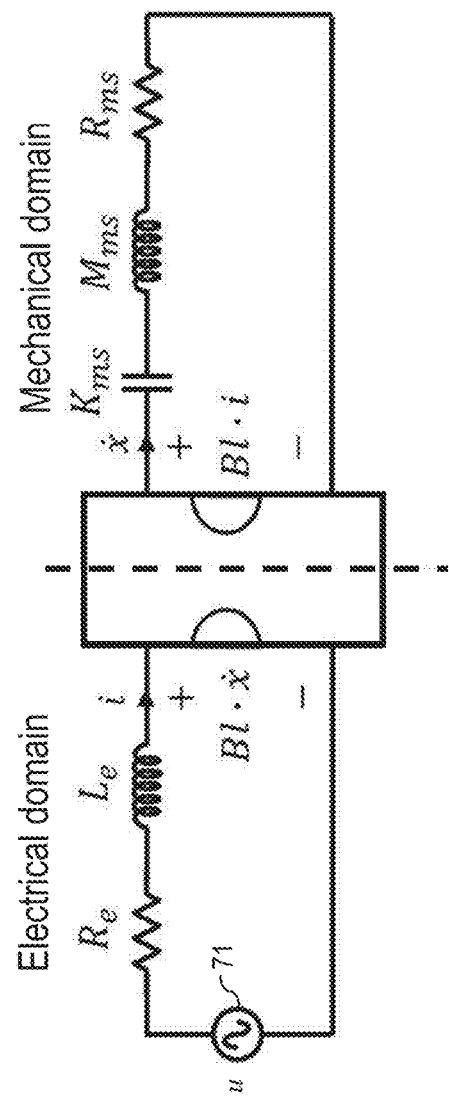
FIG. 3 illustrates an example electroacoustic model for the loudspeaker device in FIG. 2.

FIG. 3 illustrates an example electroacoustic model 70 for a loudspeaker device 40 (FIG. 2) driven by a voltage source amplifier 71. One or more loudspeaker parameters (i.e., loudspeaker characteristics) for the loudspeaker device 40 may be classified into one of the following domains: an electrical domain or a mechanical domain. In the electrical domain, examples of different loudspeaker parameters include, but are not limited to, the following: (1) an applied voltage u from the voltage source amplifier 71 for driving a speaker driver 45 of the loudspeaker device 40, (2) an electrical resistance $R_e$ of a driver voice coil 57 of the speaker driver 45, (3) a current i flowing through the driver voice coil 57 as a result of the applied voltage u, (4) an inductance $L_e$ of the driver voice coil 57, and (5) a back-electromagnetic force (back-EMF) Bl•ẋ resulting from the motion of the driver voice coil 57 in the magnetic field of the motor structure (i.e., driver voice coil 57, top plate 61, magnet 62, bottom plate 63, and pole piece 66) of the speaker driver 45, wherein the back-EMF Bl•ẋ represents a product of a force factor Bl of the motor structure and a velocity ẋ of one or more moving components of the speaker driver 45 (e.g., a diaphragm 56, the driver voice coil 57, and/or the former 64).

In the mechanical domain, examples of different loudspeaker parameters include, but are not limited to, the following: (1) the velocity $\dot{x}$ of the one or more moving components of the speaker driver 45, (2) a mechanical mass $M_{ms}$ of the one or more moving components (i.e., moving mass) and air load, (3) a mechanical resistance $R_{ms}$ representing the mechanical losses of the speaker driver 45, (4) a stiffness factor $K_{ms}$ of the suspension (i.e., surround roll 58, spider 67, plus air load) of the speaker driver 45, and (5) a mechanical force Bl•i applied on the one or more moving components, wherein the mechanical force Bl•i represents a product of the force factor Bl of the motor structure and the current i flowing through the driver voice coil 57.

The mechanical force Bl•i is proportional to the current i flowing through the driver voice coil 57, not the applied voltage u from the voltage source amplifier 71. The current i flowing through the driver voice coil 57 is affected by nonlinear impedances $R_e$ and $L_e$.

Figure 4:
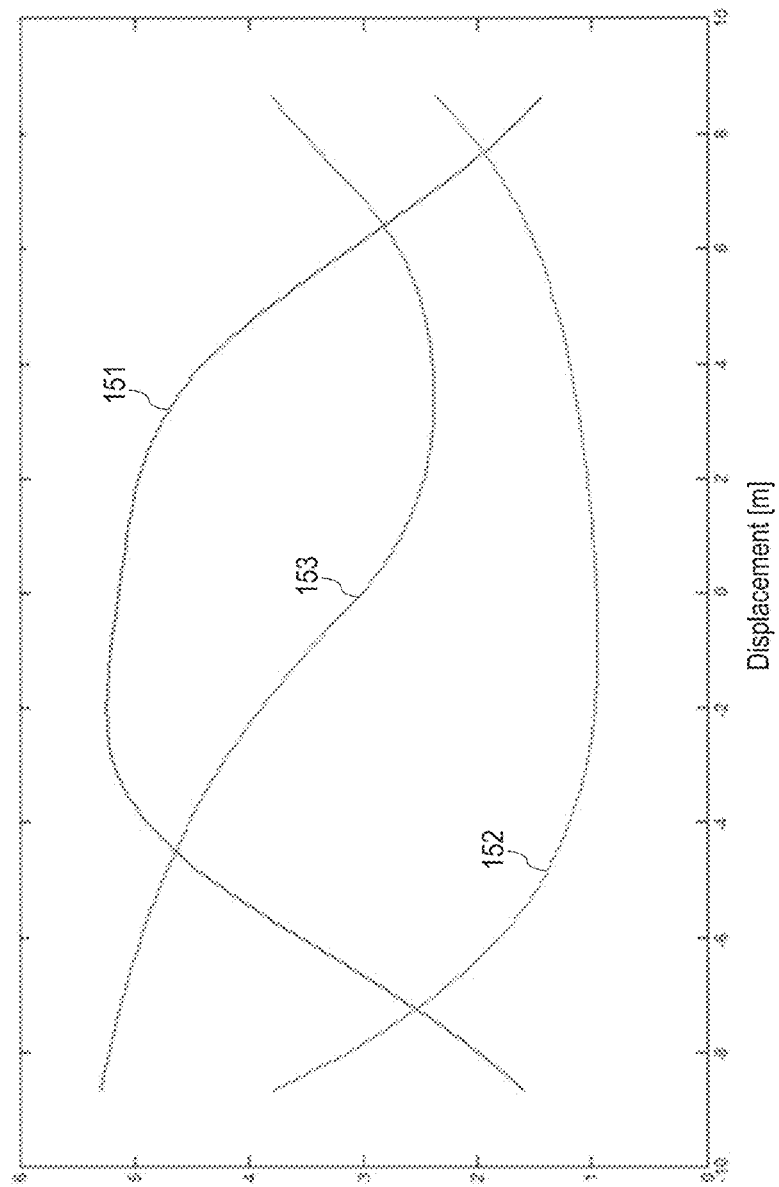
FIG. 4 is an example graph illustrating nonlinear characteristics of different large-signal loudspeaker parameters for the loudspeaker device in FIG. 2.

FIG. 4 is an example graph 150 illustrating nonlinear characteristics of different large-signal loudspeaker parameters for a loudspeaker device 40 (FIG. 2). A horizontal axis of the graph 150 represents displacement of one or more moving components (e.g., a diaphragm 56 and/or a driver voice-coil 57) of a speaker driver 45 of the loudspeaker device 40 in m. The graph 150 comprises each of the following: (1) a first curve 151 representing changes in force factor Bl in Newton per Ampere (N/A), (2) a second curve 152 representing changes in stiffness factor $K_{ms}$ in Newton per m (N/m), and (3) a third curve 153 representing changes in inductance $L_e$ in millihenry (mH). As shown in FIG. 4, the large-signal loudspeaker parameters change with displacement of the one or more moving components.

The state of a loudspeaker device 40 at each instant may be described using each of the following: (1) a displacement x of the one or more moving components of the speaker driver 45, (2) a velocity $\dot{x}$ of the one or more moving components of the speaker driver 45, and (3) a current i flowing through the driver voice coil 57. Let $X_1(t)$ generally denote a vector representing a state ("state vector representation") of the loudspeaker device 40 at a sampling time t. The state vector representation $X_1(t)$ may be defined in accordance with equation (1) provided below:

$$X_1(t) = [x, \dot{x}, i]^T \quad (1).$$

For expository purposes, the terms $X_1(t)$ and $X_1$ are used interchangeably in this specification.

Figure 5A:
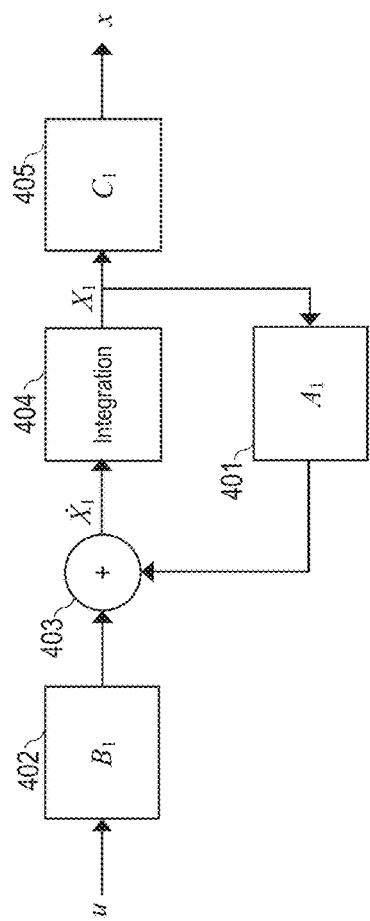
FIG. 5A illustrates an example linear system representing a linear state-space model of the loudspeaker device in FIG. 2.
Figure 5B:
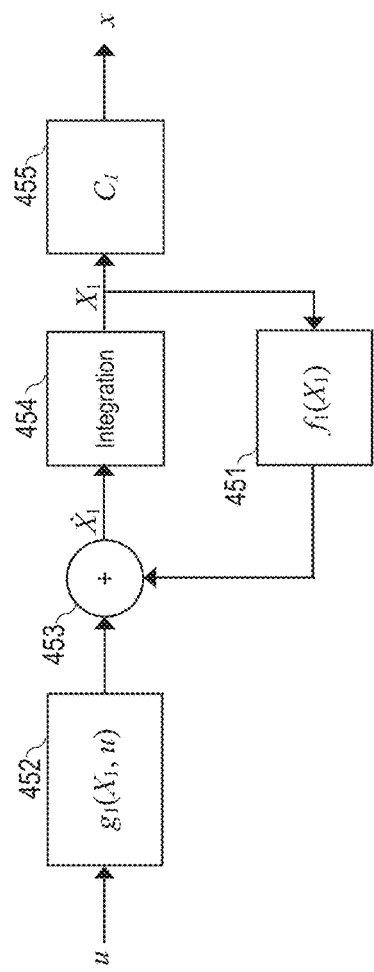
FIG. 5B illustrates an example nonlinear system representing a nonlinear state-space physical model of the loudspeaker device in FIG. 2.

As described in detail later herein below, an estimated displacement x of the one or more moving components at a sampling time t may be determined using a physical model of the loudspeaker device 40, such as a linear model (e.g., a linear state-space model as shown in FIG. 5A) or a nonlinear model (e.g., a nonlinear state-space model as shown in FIG. 5B). The physical model may be based on one or more loudspeaker parameters for the loudspeaker device 40.

FIG. 5A illustrates an example linear system 400 representing a linear state-space model of the loudspeaker device 40. The linear system 400 may be utilized to determine an estimated displacement x of one or more moving components (e.g., a diaphragm 56 and/or a driver voice coil 57) of the speaker driver 45 based on a state vector representation $X_1$ of the loudspeaker device 40 and an input voltage u of a source signal for reproduction via the loudspeaker device 40.

Let $\dot{X}_1$ generally denote a time derivative (i.e., rate of change) of the state vector representation $X_1$ of the loudspeaker device 40 ("state vector rate of change"). The state vector rate of change $\dot{X}_1$ may be defined in accordance with a differential equation (2) provided below:

$$\dot{X}_1 = A_1 X_1 + B_1 u \quad (2).$$

Let $A_1$, $B_1$, and $C_1$ denote constant parameter matrices. The constant parameter matrices $A_1$, $B_1$, and $C_1$ may be represented in accordance with equations (3)-(5) provided below:

$$A_1 = \begin{bmatrix} 0 & 1 & 0 \\ -K_{ms}/M_{ms} & -R_{ms}/M_{ms} & Bl/M_{ms} \\ 0 & -Bl/L_e & -R_e/L_e \end{bmatrix}, \quad (3)$$

$$B_1 = \begin{bmatrix} 0 \\ 0 \\ 1/L_e \end{bmatrix}, \text{ and} \quad (4)$$

$$C_1 = [1 \ 0 \ 0]. \quad (5)$$

An estimated displacement x of the one or more moving components of the speaker driver 45 may be computed in accordance with equation (6) provided below:

$$x = C_1 X_1 \quad (6).$$

Determining an estimated displacement x of the one or more moving components utilizing the linear system 400 involves performing a set of computations that are based on equations (2)-(6) provided above. The linear system 400 may utilize one or more of the following components to perform the set of computations: (1) a first multiplication unit 401 configured to determine a product term $A_1 X_1$ by multiplying the constant parameter matrix $A_1$ with the state vector representation $X_1$, (2) a second multiplication unit 402 configured to determine a product term $B_1 u$ by multiplying the constant parameter matrix $B_1$ with the input voltage u, (3) an addition unit 403 configured to determine the state vector rate of change $\dot{X}_1$ by adding the product terms $A_1 X_1$ and Bu in accordance with equation (2) provided above, (4) an integration unit 404 configured to determine the state vector representation $X_1$ by integrating the state vector rate of change $\dot{X}_1$ in the time domain, and (5) a third multiplication unit 405 configured to determine the estimated displacement x by multiplying the constant parameter matrix $C_1$ with the state vector representation $X_1$ in accordance with equation (6) provided above.

The system representation 400 in FIG. 5A is a linear system that receives an input voltage u as an input and provides an estimated displacement x as an output.

FIG. 5B illustrates an example nonlinear system 450 representing a nonlinear state-space physical model of the loudspeaker device 40. The nonlinear system 450 may be utilized to determine an estimated displacement x of one or more moving components (e.g., a diaphragm 56 and/or a driver voice coil 57) of the speaker driver 45 based on a state vector representation $X_1$ of the loudspeaker device 40 and an input voltage u of a source signal for reproduction via the loudspeaker device 40.

Let $g_1(X_1, u)$ and $f_1(X_1)$ generally denote nonlinear functions that are based on the state vector representation $X_1$ of the loudspeaker device 40 and one or more large signal loudspeaker parameters for the loudspeaker device 40. The nonlinear functions $g_1(X_1, u)$ and $f_1(X_1)$ may be represented in accordance with equations (7)-(8) provided below:

$$g_1(X_1, u) = [\begin{array}{ccc} 0 & 0 & u/L_e(x) \end{array}]^T, \text{ and} \qquad (7)$$

$$f_1(X_1) = \begin{bmatrix} \dot{x} \\ (1/M_{ms})(-K_{ms}(x)x - R_{ms}(\dot{x}) \cdot \dot{x} + Bl(x) \cdot i + (i^2/2)(dL_e/dx)) \\ (1/L_e(x))(-Bl(x) \cdot \dot{x} - R_e(T) \cdot i - (dL_e/dx)\dot{x} \cdot i) \end{bmatrix}. \qquad (8)$$

Let $C_1$ generally denote a constant parameter matrix. The constant parameter matrix $C_1$ may be represented in accordance with equation (9) provided below:

$$C_1 = [1 \ 0 \ 0] \qquad (9).$$

Let $\dot{X}_1$ generally denote a time derivative (i.e., rate of change) of the state vector representation $X_1$ of the loudspeaker device 40 ("state vector rate of change"). The state vector rate of change $\dot{X}_1$ may be defined in accordance with a differential equation (10) provided below:

$$\dot{X}_1 = g_1(X_1, u) + f_1(X_1) \qquad (10).$$

An estimated displacement x of the one or more moving components of the speaker driver 45 may be computed in accordance with equation (11) provided below:

$$x = C_1 X_1 \qquad (11).$$

Determining an estimated displacement x of the one or more moving components utilizing the nonlinear system 450 involves performing a set of computations that are based on equations (7)-(11) provided above. The nonlinear system 450 may utilize one or more of the following components to perform the set of computations: (1) a first computation unit 451 configured to compute the nonlinear function $f_1(X_1)$ in accordance with equation (8) provided above, (2) a second computation unit 452 configured to compute the nonlinear function $g_1(X_1, u)$ in accordance with equation (7) provided above, (3) an addition unit 453 configured to determine the state vector rate of change $\dot{X}_1$ by adding the nonlinear functions $g_1(X_1, u)$ and $f_1(X_1)$ in accordance with equation (10) provided above, (4) an integration unit 454 configured to determine the state vector representation $X_1$ by integrating the state vector rate of change $\dot{X}_1$ in the time-domain, and (5) a multiplication unit 455 configured to determine the estimated displacement x by multiplying the constant parameter matrix $C_1$ with the state vector representation $X_1$ in accordance with equation (11) provided above.

The system representation 450 in FIG. 5B is a nonlinear system that receives an input voltage u as an input and provides an estimated displacement x as an output.

Compared to conventional loudspeakers, one or more embodiments provide a system for nonlinear control ("nonlinear control system") of a loudspeaker device with a current source amplifier. The nonlinear control system is configured to improve sound quality of the loudspeaker device by reducing audio distortion. In one embodiment, the nonlinear control system provides correction of nonlinear audio distortion by pre-distorting current to a speaker driver of the loudspeaker device. The nonlinear control system provides improved performance in terms of reduced audio distortion, bass extension, displacement control, and loudspeaker protection.

The nonlinear control system is configured to increase or maximize bass output of the loudspeaker device by controlling motion of one or more moving components (e.g., a diaphragm and/or a driver voice coil) of the speaker driver. In one embodiment, the nonlinear control system enables linearization of the loudspeaker device by providing nonlinear control of motion of the one or more moving components. This allows for increased/maximum bass extension, thereby enhancing bass output of the loudspeaker device. By preventing excessive displacements of the one or more moving components and overheating of the loudspeaker device, the nonlinear control system provides improved protection of the loudspeaker device.

Figure 6:
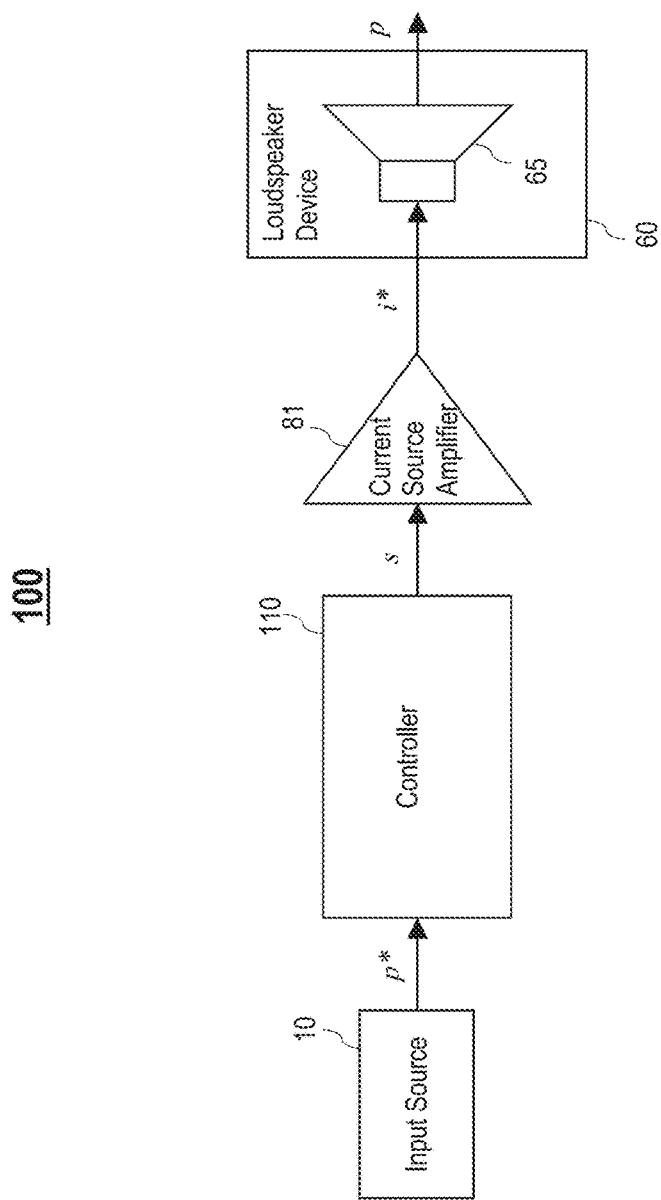
FIG. 6 illustrates an example loudspeaker control system for nonlinear control of a loudspeaker device with a current source amplifier, in accordance with an embodiment.

FIG. 6 illustrates an example loudspeaker system 100, in accordance with an embodiment. The loudspeaker system 100 is an example nonlinear control system for a loudspeaker device with a current source amplifier. Specifically, the loudspeaker system 100 comprises a loudspeaker device 60 including a speaker driver 65 for reproducing sound. The loudspeaker device 60 may be any type of loudspeaker device such as, but not limited to, a sealed-box loudspeaker, a vented-box loudspeaker, a passive radiator loudspeaker, a loudspeaker array, etc. The speaker driver 65 may be any type of speaker driver such as, but not limited to, a forward-facing speaker driver, an upward-facing speaker driver, a downward-facing speaker driver, etc. The speaker driver 55 in FIG. 1 is an example implementation of the speaker driver 65. The speaker driver 65 comprises one or more moving components, such as a diaphragm 56 (FIG. 1) and a driver voice coil 57 (FIG. 1).

The loudspeaker system 100 comprises a controller 110 configured to receive a source signal (e.g., an input audio signal) from an input source 10 for reproduction via the loudspeaker device 60. In one embodiment, the controller 110 is configured to receive a source signal from different types of input sources 10. Examples of different types of input sources 10 include, but are not limited to, a mobile electronic device (e.g., a smartphone, a laptop, a tablet, etc.), a content playback device (e.g., a television, a radio, a computer, a music player such as a CD player, a video player such as a DVD player, a turntable, etc.), or an audio receiver, etc.

Let p* generally denote a target (i.e., desired) sound pressure for the loudspeaker device 60 to deliver during the reproduction of the source signal. As described in detail later herein, the controller 110 is configured to determine, based on a physical model of the loudspeaker device 60 and a target sound pressure p* at a sampling time t, one or more of the following: (1) a target displacement (e.g., target cone displacement) x* of the one or more moving components at the sampling time t, and (2) a target current i* that produces the target displacement x* at the sampling time t. For expository purposes, the terms "target current" and "control current" may be used interchangeably in this specification. The controller 110 is configured to generate and transmit a control current signal s specifying the target current i* determined to a current source amplifier 81 of the loudspeaker system 100. The control current signal s can be any type of signal such as, but not limited to, a current, a voltage, a digital signal, an analog signal, etc.

Figure 8A:
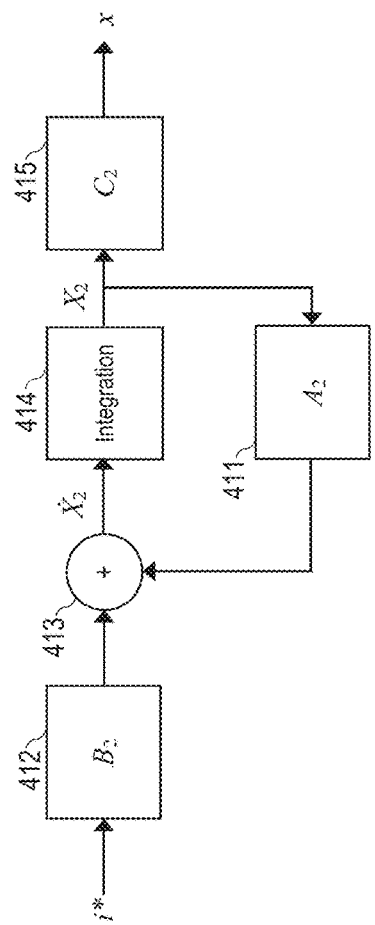
FIG. 8A illustrates an example linear system representing a linear state-space model of the loudspeaker device in FIG. 6, in accordance with an embodiment.
Figure 8B:
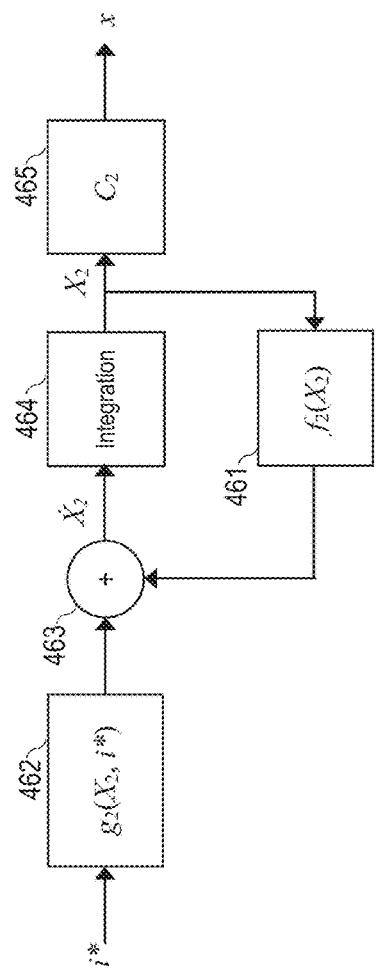
FIG. 8B illustrates an example nonlinear system representing a nonlinear state-space model of the loudspeaker device in FIG. 6, in accordance with an embodiment.

A physical model of the loudspeaker device 60 may be based on one or more loudspeaker parameters for the loudspeaker device 60. In one embodiment, a physical model of the loudspeaker device 60 utilized by the controller 110 is a linear model (e.g., a linear state-space model as shown in FIG. 8A). In another embodiment, a physical model of the loudspeaker device 60 utilized by the controller 110 is a nonlinear model (e.g., a nonlinear state-space model as shown in FIG. 8B).

As shown in FIG. 6, the current source amplifier 81 is connected to the loudspeaker device 60 and the controller 110. The current source amplifier 81 is a power amplifier configured to output (i.e., apply or produce), for each sampling time t, an actual current (i.e., applied current) i* based on a control current signal s received from the controller 110, wherein the control current signal s specifies a target current i* determined by the controller 110 at the sampling time t. The control current signal s controls the current source amplifier 81, directing the current source amplifier 81 to output an amount of current that is substantially the same as the target current i*. The speaker driver 65 is driven by the actual current i* output by the current source amplifier 81, thereby controlling an actual displacement of the one or more moving components during the reproduction of the source signal. Specifically, the loudspeaker system 100 controls cone displacement/motion of the one or more moving components by performing current correction based on the target current i*, resulting in production of a target sound wave with a target sound pressure p* at the sampling time t. The target current i* limits an actual displacement (e.g., actual cone displacement) of the one or more moving components within a predetermined range of safe displacement.

The loudspeaker system 100 facilitates a higher level of audio reproduction, with improved sound quality, and additional control and protection of the loudspeaker device 60.

As described in detail later herein, the controller 110 is configured to counter audio distortion during the reproduction of the source signal via the speaker driver 65 by calculating a target current i* that is required to produce a target sound pressure p* at each instant/sampling time t based on an instantaneous position of the one or more moving components, wherein an actual current output of the current source amplifier 81 is substantially equal to the target current i*.

In one embodiment, the loudspeaker system 100 may be integrated in different types of electrodynamic transducers with a broad range of applications such as, but not limited to, the following: computers, televisions (TVs), smart devices (e.g., smart TVs, smart phones, etc.), soundbars, subwoofers, wireless and portable speakers, mobile phones, car speakers, etc.

Compared to conventional systems that utilize a voltage source amplifier (e.g., the loudspeaker device 40 driven by the voltage source amplifier 71 in FIG. 2), the loudspeaker system 100 implements nonlinear control of the loudspeaker device 60 with the current source amplifier. As described in detail later herein, the loudspeaker system 100 with current source amplifier is a simplified nonlinear control system with reduced requirements and costs. For example, the loudspeaker system 100 may require about half of digital signal processing (DSP) requirements of similar loudspeaker systems with voltage source amplifier, and has lower costs.

Figure 7:
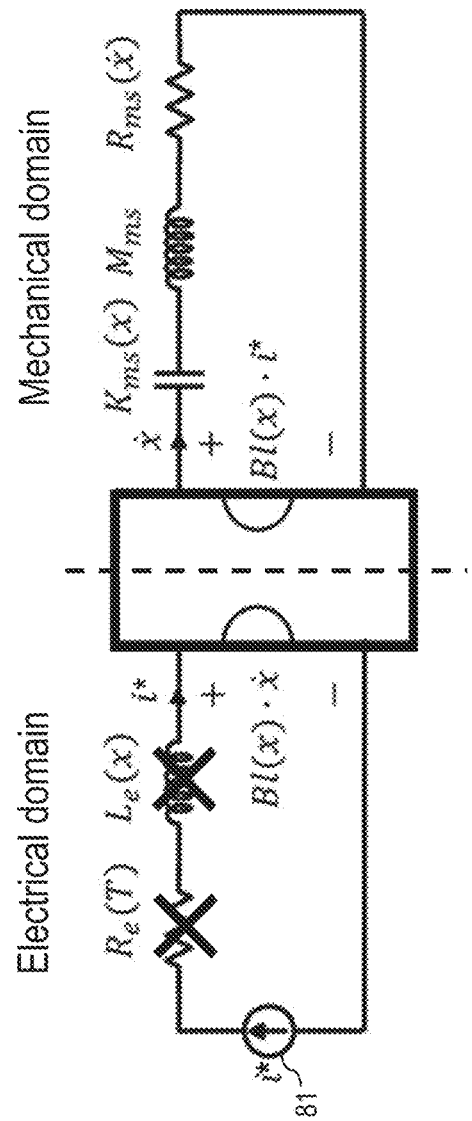
FIG. 7 illustrates an example electroacoustic model for the loudspeaker device in FIG. 6, in accordance with an embodiment.

FIG. 7 illustrates an example electroacoustic model 80 for the loudspeaker device 60, in accordance with an embodiment. One or more loudspeaker parameters (i.e., loudspeaker characteristics) for the loudspeaker device 60 may be classified into one of the following domains: an electrical domain or a mechanical domain. In the electrical domain, examples of different loudspeaker parameters include, but are not limited to, the following: (1) an actual current i* output by the current source amplifier 81 for driving a speaker driver 65 of the loudspeaker device 60, (2) an electrical resistance $R_e(T)$ of a driver voice coil 57 of the speaker driver 65, (3) an inductance $L_e(x)$ of the driver voice coil 57, and (4) a back-EMF Bl(x)•ẋ resulting from the motion of the driver voice coil 57 in the magnetic field of the motor structure (i.e., driver voice coil 57, top plate 61, magnet 62, bottom plate 63, and pole piece 66) of the speaker driver 65, wherein the back-EMF Bl•ẋ represents a product of a force factor Bl of the motor structure and a velocity ẋ of one or more moving components of the speaker driver 65 (e.g., a diaphragm 56, the driver voice coil 57, and/or the former 64).

In the mechanical domain, examples of different loudspeaker parameters include, but are not limited to, the following: (1) the velocity ẋ of the one or more moving components of the speaker driver 65, (2) a mechanical mass $M_{ms}$ of the one or more moving components (i.e., moving mass) and air load, (3) a resistance $R_{ms}(\dot{x})$ representing mechanical losses of the speaker driver 65, (4) a stiffness factor $K_{ms}(x)$ of the suspension (i.e., surround roll 58, spider 67, plus air load) of the speaker driver 65, and (5) a mechanical force Bl(x)•i* applied on the one or more moving components, wherein the mechanical force Bl(x)•i* represents a product of the force factor Bl(x) of the driver voice coil 57 and the actual current i* output by the current source amplifier 81.

Unlike a loudspeaker device driven by a voltage source amplifier (e.g., the loudspeaker device 40 in FIG. 2), nonlinear impedances $R_e(T)$ and $L_e(x)$ have no effect on the mechanical force Bl(x)•i* applied on the one or more moving components of the speaker driver 65 because the actual current i* output by the current source amplifier 81 flows independent of the nonlinear impedances $R_e(T)$ and $L_e(x)$. As the actual current i* output by the current source amplifier 81 flows independent of nonlinear impedances, the controller 110 of the loudspeaker system 100 need not factor in these nonlinear impedances when performing computations, thereby simplifying the computations performed. As a result of the simplified computations, the loudspeaker system 100 may require about half of DSP requirements of conventional systems, and has lower costs.

A state of the loudspeaker device 60 at each instant may be described using each of the following: (1) a target displacement x of the one or more moving components of the speaker driver 65, and (2) a velocity ẋ of the one or more moving components of the speaker driver 65. Let $X_2(t)$ generally denote a vector representing a state ("state vector representation") of the loudspeaker device 60 at a sampling time t. In one embodiment, the state vector representation $X_2(t)$ may be defined in accordance with equation (12) provided below:

$$X_2(t) = [x, \dot{x}]^T \qquad (12).$$

For expository purposes, the terms $X_2(t)$ and $X_2$ are used interchangeably in this specification.

FIG. 8A illustrates an example linear system 410 representing a linear state-space model of the loudspeaker device 60, in accordance with an embodiment. The linear system 410 may be utilized to determine an estimated displacement x of one or more moving components (e.g., a diaphragm 56 and/or a driver voice coil 57) of the speaker driver 65 based on a state vector representation $X_2$ of the loudspeaker device 60 and a current i* output by the current source amplifier 81 for driving the speaker driver 65.

Let $A_2$, $B_2$, and $C_2$ generally denote constant parameter matrices. In one embodiment, the constant parameter matrices $A_2$, $B_2$, and $C_2$ may be represented in accordance with equations (13)-(15) provided below:

$$A_2 = \begin{bmatrix} 0 & 1 \\ -K_{ms}/M_{ms} & -R_{ms}/M_{ms} \end{bmatrix}, \qquad (13)$$

$$B_2 = \begin{bmatrix} 0 \\ Bl/M_{ms} \end{bmatrix}, \text{ and} \qquad (14)$$

$$C_2 = [1 \ 0]. \qquad (15)$$

Let $\dot{X}_2$ generally denote a time derivative (i.e., rate of change) of the state vector representation $X_2$ of the loudspeaker device 60 ("state vector rate of change"). In one embodiment, the state vector rate of change $\dot{X}_2$ may be defined in accordance with a differential equation (16) provided below:

$$\dot{X}_2 = A_2 X_2 \pm B_2 i^* \qquad (16).$$

In one embodiment, an estimated displacement x of the one or more moving components may be computed in accordance with equation (17) provided below:

$$x = C_2 X_2 \qquad (17).$$

In one embodiment, the controller 110 of the loudspeaker system 100 is configured to recursively determine an estimated displacement x of the one or more moving components utilizing the linear system 410. Recursively determining an estimated displacement x of the one or more moving components utilizing the linear system 410 involves performing a recursive set of computations that are based on equations (13)-(17) provided above. In one example implementation, the controller 110 comprises one or more of the following components: (1) a first multiplication unit 411 configured to determine a product term $A_2 X_2$ by multiplying the constant parameter matrix $A_2$ with the state vector representation $X_2$, (2) a second multiplication unit 412 configured to determine a product term $B_2 i^*$ by multiplying the constant parameter matrix $B_2$ with the current $i^*$, (3) an addition unit 413 configured to determine the state vector rate of change $\dot{X}_2$ by adding the product terms $A_2 X_2$ and $B_2 i^*$ in accordance with equation (16) provided above, (4) an integration unit 414 configured to determine the state vector representation $X_2$ by integrating the state vector rate of change $\dot{X}_2$ in the time-domain, and (5) a third multiplication unit 415 configured to determine an estimated displacement x by multiplying the constant parameter matrix $C_2$ with the state vector representation $X_2$ in accordance with equation (17) provided above.

As shown in FIG. 8A, the system 410 is a linear system that receives a current $i^*$ as an input and provides an estimated displacement x as an output. Compared to the linear system 400 in FIG. 5A, utilizing the linear system 410 provides a reduction of system order with simplification of system transfer function. As the current $i^*$ flows independent of nonlinear impedances $R_e(T)$ and $L_e(x)$ (i.e., no $R_e(T)$ and $L_e(x)$ dependence), the current source amplifier 81 provides an output (i.e., $i^*$) with high impedance and the system transfer function is unaffected by changes in the nonlinear impedances, thereby removing the need to optimize such nonlinear impedances. Therefore, utilizing the linear system 410 simplifies the nonlinear control of the loudspeaker device 60 and computations performed by the controller 110. As a result, the loudspeaker system 100 may require about half of DSP requirements of conventional systems, and has lower costs.

FIG. 8B illustrates an example nonlinear system 460 representing a nonlinear state-space model of the loudspeaker device 60, in accordance with an embodiment. The nonlinear system 460 may be utilized to determine an estimated displacement x of one or more moving components (e.g., a diaphragm 56 and/or a driver voice coil 57) of the speaker driver 65 based on a state vector representation $X_2$ of the loudspeaker device 60 and a current $i^*$ output by the current source amplifier 81 for driving the speaker driver 65.

Let $g_2(X_2, i^*)$ and $f_2(X_2)$ generally denote nonlinear functions that are based on the state vector representation $X_2$ of the loudspeaker device 60 and one or more large signal loudspeaker parameters for the loudspeaker device 60. In one embodiment, the nonlinear functions $g_2(X_2, i^*)$ and $f_2(X_2)$ are represented in accordance with equations (18)-(19) provided below:

$$g_2(X_2, i^*) = [\ 0 \quad Bl(x) \cdot i^*/M_{ms}\ ]^T, \text{ and} \qquad (18)$$

$$f_2(X_2) = \begin{bmatrix} \dot{x} \\ (1/M_{ms})(-K_{ms}(x) \cdot x - R_{ms}(\dot{x}) \cdot \dot{x}) \end{bmatrix}. \qquad (19)$$

Let $C_2$ generally denote a constant parameter matrix. In one embodiment, the constant parameter matrix $C_2$ may be represented in accordance with equation (20) provided below:

$$C_2 = [1\ 0] \qquad (20).$$

Let $\dot{X}_2$ generally denote a time derivative (i.e., rate of change) of the state vector representation $X_2$ of the loudspeaker device 60 ("state vector rate of change"). In one embodiment, the state vector rate of change $\dot{X}_2$ may be defined in accordance with a differential equation (21) provided below:

$$\dot{X}_2 = = g_2(X_2, i^*) + f_2(X_2) \qquad (21).$$

In one embodiment, an estimated displacement x of the one or more moving components of the speaker driver 65 may be computed in accordance with equation (22) provided below:

$$x = C_2 X_2 \qquad (22).$$

In one embodiment, the controller 110 of the loudspeaker system 100 is configured to recursively determine an estimated displacement x of the one or more moving components of the speaker driver 65 utilizing the nonlinear system 460. Recursively determining an estimated displacement x of the one or more moving components utilizing the nonlinear system 460 involves performing a recursive set of computations that are based on equations (18)-(22) provided above. The nonlinear system 460 may utilize one or more of the following components to perform the set of computations: (1) a first computation unit 461 configured to compute nonlinear function $f_2(X_2)$ in accordance with equation (19) provided above, (2) a second computation unit 462 configured to compute nonlinear function $g_2(X_2, i^*)$ in accordance with equation (18) provided above, (3) an addition unit 463 configured to determine the state vector rate of change $\dot{X}_2$ by adding the nonlinear functions $g_2(X_2, i^*)$ and $f_2(X_2)$ in accordance with equation (21) provided above, (4) an integration unit 464 configured to determine the state vector representation $X_2$ by integrating the state vector rate of change $\dot{X}_2$ in the time-domain, and (5) a multiplication unit 465 configured to determine an estimated displacement x by multiplying the constant parameter matrix $C_2$ with the state vector representation $X_2$ in accordance with equation (22) provided above.

As shown in FIG. 8B, the system 460 is a nonlinear system that receives a current $i^*$ as an input and provides an estimated displacement x as an output. Compared to the linear system 450 in FIG. 5B, utilizing the nonlinear system 460 provides a reduction of system order with simplification of system transfer function. As the current $i^*$ flows independent of nonlinear impedances $R_e(T)$ and $L_e(x)$ (i.e., no $R_e(T)$ and $L_e(x)$ dependence), the current source amplifier 81 provides an output (i.e., $i^*$) with high impedance and the system transfer function is unaffected by changes in the nonlinear impedances, thereby removing the need to optimize such nonlinear impedances. Therefore, utilizing the nonlinear system 460 simplifies the control of the loudspeaker device 60 and computations performed by the controller 110. As a result, the loudspeaker system 100 may require about half of DSP requirements of conventional systems, and has lower costs.

Figure 9:
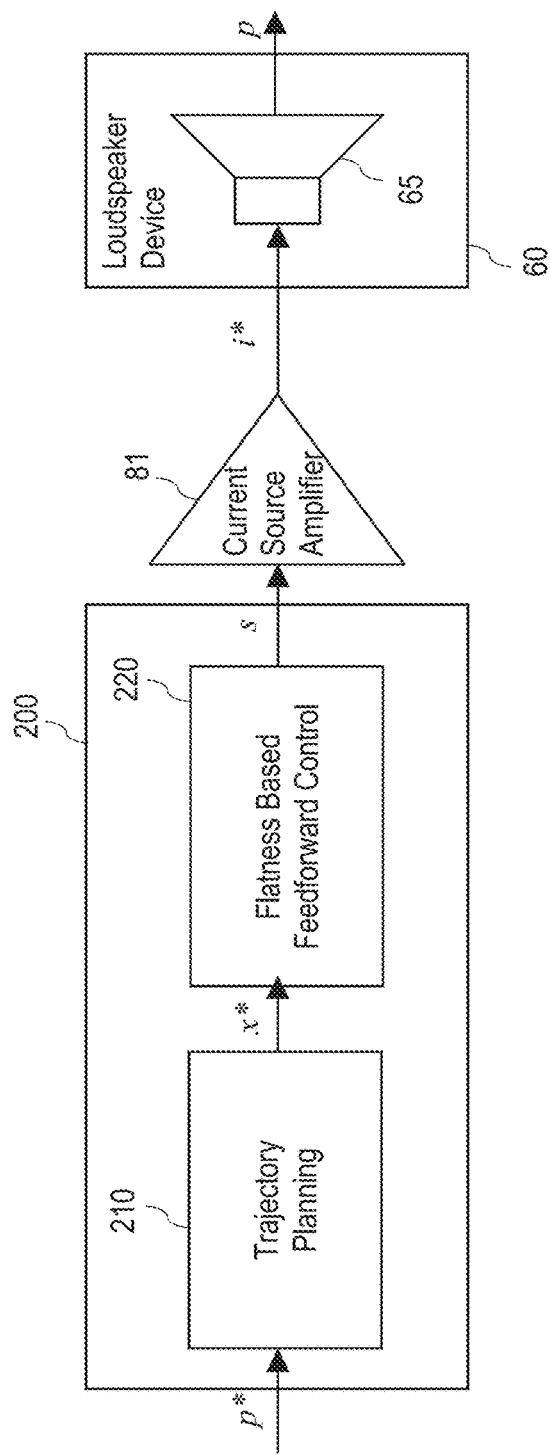
FIG. 9 illustrates an example controller for the loudspeaker device in FIG. 6, in accordance with an embodiment.

FIG. 9 illustrates an example controller 200 for the loudspeaker device 60, in accordance with an embodiment. In one embodiment, the controller 110 of the loudspeaker system 100 is the controller 200. In one embodiment, the controller 200 comprises a trajectory planning unit 210 configured to determine a target displacement (i.e., target cone displacement) x* of one or more moving components (e.g., diaphragm 56 and/or driver voice coil 57) of the speaker driver 65 at each sampling time t based on a physical model of the loudspeaker device 60 and a target sound pressure p* for the loudspeaker device 60 to deliver during reproduction of a source signal (e.g., input audio signal) at the sampling time t. In one embodiment, the loudspeaker system 100 is configured to determine the target sound pressure p* from the source signal.

In one embodiment, the trajectory planning unit 210 utilizes a linear model (e.g., linear state-space model 400 in FIG. 5A or 410 in FIG. 8A) to determine a target displacement x* of the one or more moving components, thereby implementing a trajectory planning that includes linear processing of the source signal. In another embodiment, the trajectory planning unit 210 utilizes a nonlinear model (e.g., nonlinear state-space model 450 in FIG. 5B or 460 in FIG. 8B) to determine a target displacement x* of the one or more moving components.

In one embodiment, the controller 200 comprises a flatness based feedforward control unit 220 that implements feedforward control to determine a control current i* for each sampling time t. Specifically, the flatness based feedforward control unit 220 is configured to determine, based on a target displacement x* for a sampling time t received from the trajectory planning unit 210 and a physical model of the loudspeaker device 60 (e.g., a nonlinear model), a control current i* to drive the speaker driver 65 to produce the target displacement x*.

In one embodiment, the flatness based feedforward control unit 220 is configured to determine a control current i* at a sampling time t based on a nonlinear model of the loudspeaker device 60. For example, in one embodiment, if the loudspeaker device 60 is a sealed-box loudspeaker, the flatness based feedforward control unit 220 may determine a control current i* at a sampling time t in accordance with a single equation (23) provided below:

$$i^* = (K_{ms}(x^*) \cdot x^* + R_{ms}(\dot{x}^*) \cdot \dot{x} + M_{ms} \cdot \ddot{x}^*)/Bl(x^*) \quad (23),$$

wherein $\dot{x}^*$ is a target velocity (e.g., target cone velocity) of the one or more moving components of the speaker driver 65, $\ddot{x}^*$ is a target acceleration (e.g., target cone acceleration) of the one or more moving components, $K_{ms}(x^*)$ is a stiffness factor of the suspension (i.e., surround roll 58, spider 67, plus air load) of the speaker driver 65 based on the target displacement x*, $R_{ms}(\dot{x}^*)$ is a resistance representing the mechanical losses of the speaker driver 65 based on the target velocity $\dot{x}^*$, and $Bl(x^*)$ is a force factor of a driver voice coil 57 of the speaker driver 65 based on the target displacement x*. The flatness based feedforward control unit 220 is configured to generate and transmit a control current signal s specifying the control current i* determined to the current source amplifier 81 of the loudspeaker system 100. The control current signal s can be any type of signal such as, but not limited to, a current, a voltage, a digital signal, an analog signal, etc.

The current source amplifier 81 of the loudspeaker system 100 is configured to output (i.e., apply or produce), for each sampling time t, an actual current (i.e., applied current) i* based on a control current signal s received from the flatness based feedforward control unit 220, wherein the control current signal s specifies a control current i* determined by the flatness based feedforward control unit 220 at the sampling time t. The control current signal s controls the current source amplifier 81, directing the current source amplifier 81 to output an amount of current that is substantially the same as the control current i* at the sampling time t. The speaker driver 65 is driven by the actual current i* from the current source amplifier 81, thereby controlling an actual displacement (i.e., actual cone displacement) of the one or more moving components of the speaker driver 65 during the reproduction of the source signal and resulting in production of a sound wave with an actual sound pressure p.

Figure 10:
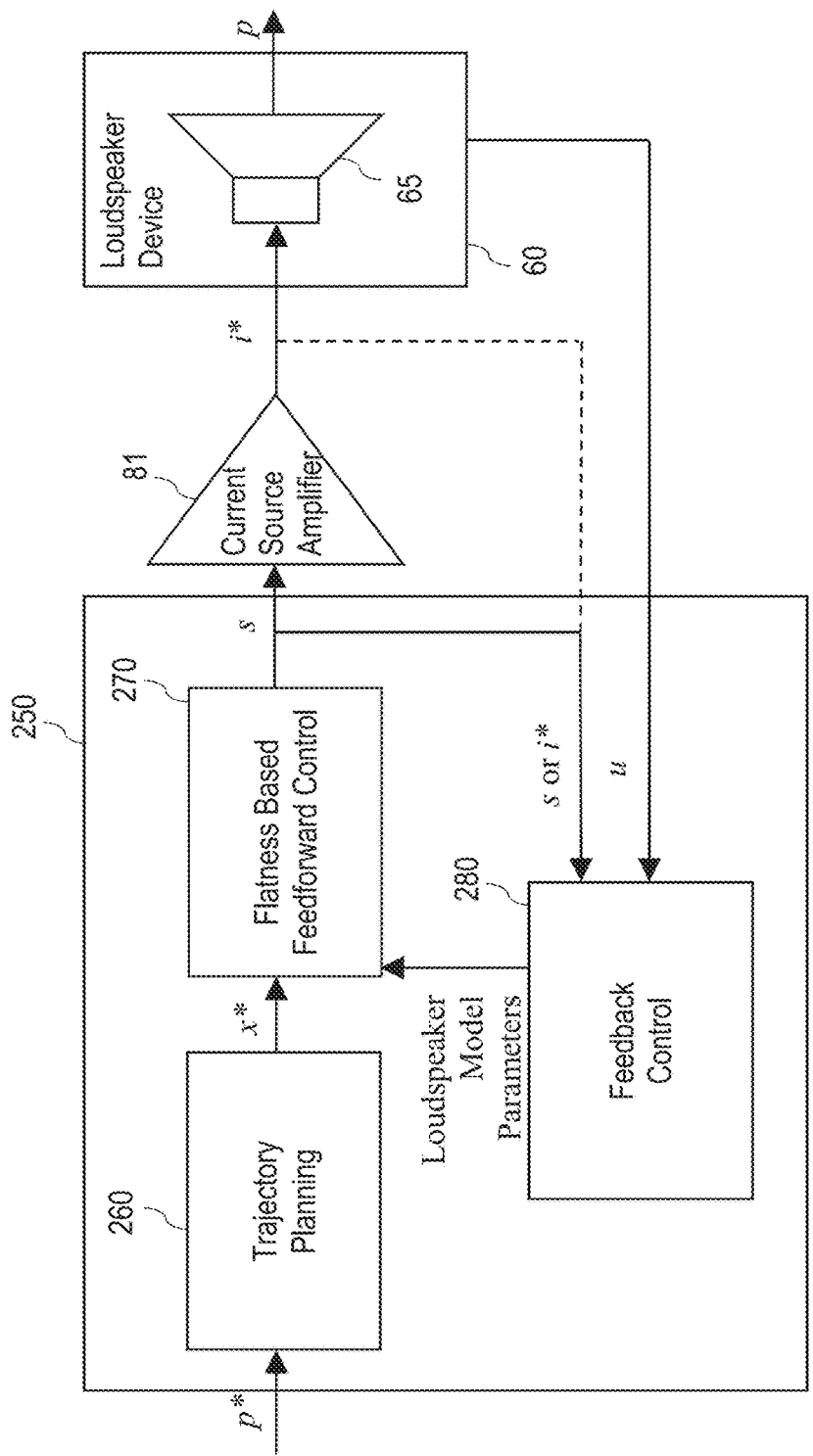
FIG. 10 illustrates another example controller for the loudspeaker device in FIG. 6, in accordance with an embodiment.

FIG. 10 illustrates an example controller 250 for the loudspeaker device 60, in accordance with an embodiment. In one embodiment, the controller 110 of the loudspeaker system 100 is the controller 250. In one embodiment, the controller 250 comprises a trajectory planning unit 260 configured to determine a target displacement (i.e., target cone displacement) x* of one or more moving components (e.g., diaphragm 56 and/or driver voice coil 57) of the speaker driver 65 at each sampling time t based on a physical model of the loudspeaker device 60 and a target sound pressure p* for the loudspeaker device 60 to deliver during reproduction of a source signal (e.g., input audio signal) at the sampling time t.

In one embodiment, the trajectory planning unit 260 utilizes a linear model (e.g., linear state-space model 400 in FIG. 5A or 410 in FIG. 8A) to determine a target displacement x* of the one or more moving components, thereby implementing a trajectory planning that includes linear processing of the source signal. In another embodiment, the trajectory planning unit 260 utilizes a nonlinear model (e.g., nonlinear state-space model 450 on FIG. 5B or 460 in FIG. 8B) to determine a target displacement x* of the one or more moving components.

In one embodiment, the controller 250 comprises a flatness based feedforward control unit 270 that implements feedforward control to determine a control current i* for each sampling time t. Specifically, the flatness based feedforward control unit 270 is configured to determine, based on a target displacement x* for a sampling time t received from the trajectory planning unit 260 and a physical model of the loudspeaker device 60, a control current i* to drive the speaker driver 65 to produce the target displacement x*.

In one embodiment, the flatness based feedforward control unit 270 is configured to determine a control current i* at a sampling time t based on a nonlinear model of the loudspeaker device 60. For example, in one embodiment, if the loudspeaker device 60 is a sealed-box loudspeaker, the flatness based feedforward control unit 270 may determine a control current i* at a sampling time t in accordance with the single equation (23) provided above. The flatness based feedforward control unit 270 is configured to generate and transmit a control current signal s specifying the control current i* determined to the current source amplifier 81 of the loudspeaker system 100. The control current signal s can be any type of signal such as, but not limited to, a current, a voltage, a digital signal, an analog signal, etc.

The current source amplifier 81 of the loudspeaker system 100 is configured to output (i.e., apply or produce), for each sampling time t, an actual current (i.e., applied current) i* based on a control current signal s received from the flatness based feedforward control unit 270, wherein the control current signal s specifies a control current i* determined by the flatness based feedforward control unit 270 at the sampling time t. The control current signal s controls the current source amplifier 81, directing the current source amplifier 81 to output an amount of current that is substantially the same as the control current i* at the sampling time t. The speaker driver 65 is driven by the actual current i* from the current source amplifier 81, thereby controlling an actual displacement (i.e., actual cone displacement) of the one or more moving components of the speaker driver 65 during the reproduction of the source signal and resulting in production of a sound wave with an actual sound pressure p at the sampling time t.

In one embodiment, the controller 250 is configured to monitor a voltage u measured at the terminals of the speaker driver 65 at each sampling time t. The controller 250 further comprises feedback control unit 280 configured to recalculate, based on the measured voltage u and the actual current i* from the current source amplifier 81, the one or more loudspeaker model parameters for the loudspeaker device 60. Feedback control unit 280 provides updates of the one or more loudspeaker model parameters to the flatness based feedforward control unit 270. The updates of the one or more loudspeaker model parameters may be used to minimize the inaccuracies. For example, the loudspeaker model parameters may be adjusted to compensate for variations originating from intrinsic and extrinsic variations, such as manufacturing tolerances, present operating conditions (e.g., temperature of driver voice coil 57), environmental effects such as pressure and temperature, and aging of components and materials of the loudspeaker system 100. Therefore, the loudspeaker system 100 may account for changes in components and materials that vary over time and environmental conditions, and counter detrimental effects of temperature (e.g., resistance variation of driver voice coil 57), pressure, and aging.

In one embodiment, the controller 250 is configured to monitor a voltage u measured at the terminals of the speaker driver 65 at each sampling time t. The controller 250 further comprises feedback control unit 280 configured to recalculate, based on the measured voltage u and the control current signal s from the flatness based feedforward control unit 270, the one or more loudspeaker model parameters for the loudspeaker device 60. Feedback control unit 280 provides updates of the one or more loudspeaker model parameters to the flatness based feedforward control unit 270. The updates of the one or more loudspeaker model parameters may be used to minimize the inaccuracies, providing improved control of the loudspeaker device, with reduced distortion.

Based on the loudspeaker model parameters generated, any resulting correction performed (e.g., current correction, or corrections to the one or more loudspeaker model parameters) may compensate for one or more inaccuracies (e.g., manufacturing dispersion, environmental conditions, component aging effects) associated with a physical model utilized by the controller 250 and/or audio drifting (e.g., resulting from heating of the loudspeaker device 60). The correction performed may be used to minimize the inaccuracies.

For example, in one embodiment, the corrections to the one or more loudspeaker parameters may be used to provide a correction to the stiffness factor thereby improving the accuracy of the loudspeaker system 100 and the quality of audio output produced by the loudspeaker device 60.

The feedback control implemented by the flatness based feedforward control unit 270 may be based on various control methods such as, but not limited to, state feedback control, adaptive control (e.g., using an online system identification), Proportional-Integral-Derivative (PID) control, etc.

In another embodiment, if the speaker driver 65 has well known and stable characteristics, the flatness based feedforward control unit 270 need not factor into account any corrections, thereby removing the need for the feedback control unit 280 (e.g., similar to the controller 200 in FIG. 9).

Figure 11:
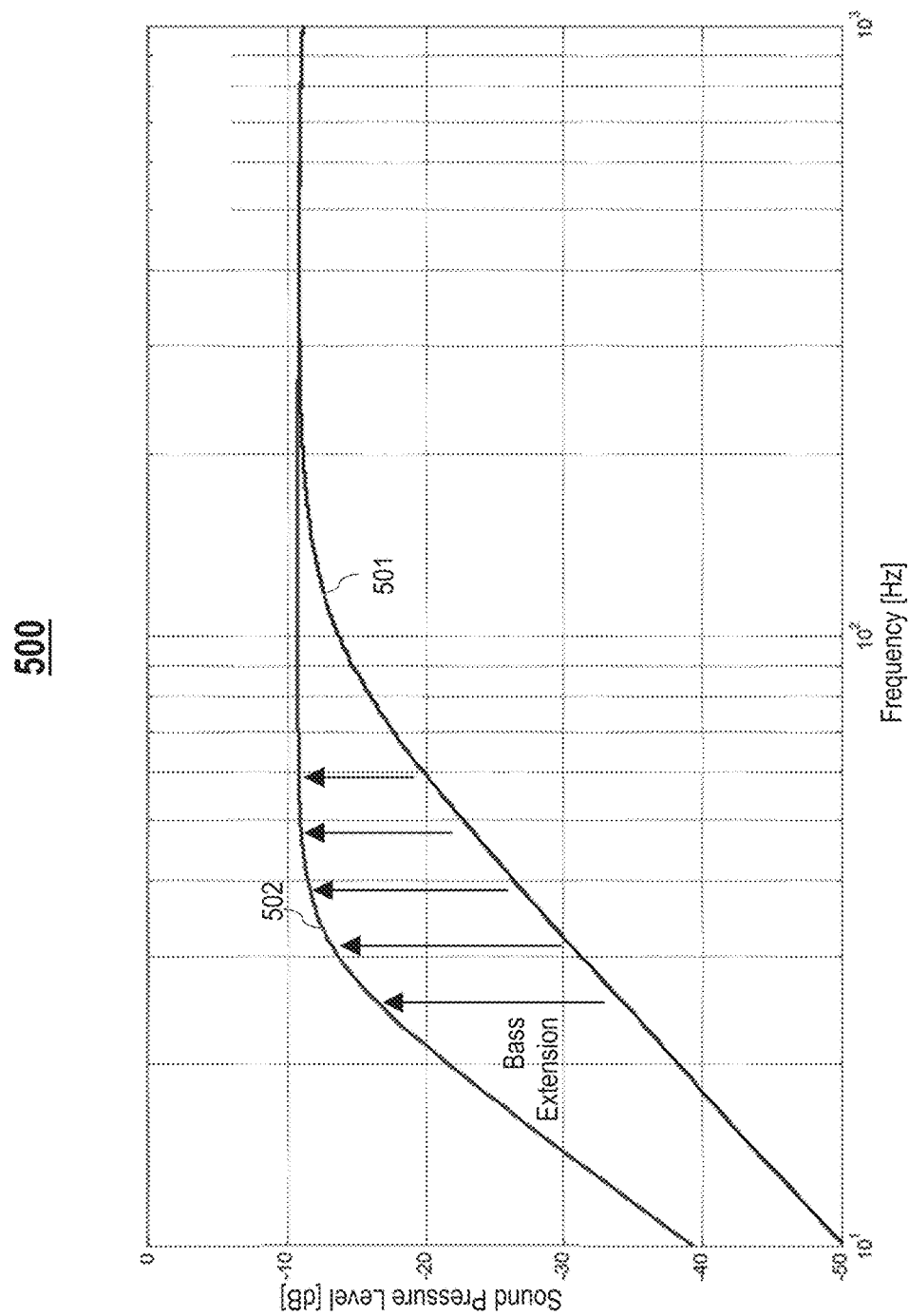
FIG. 11 is an example graph comparing frequency responses of a loudspeaker device with nonlinear control active and the same loudspeaker device without nonlinear control active, in accordance with an embodiment.

FIG. 11 is an example graph 500 comparing frequency responses of a loudspeaker device with nonlinear control active and the same loudspeaker device without nonlinear control active, in accordance with an embodiment. A horizontal axis of the graph 500 represents frequency in Hz. A vertical axis of the graph 500 represents sound pressure level in dB. The graph 500 comprises a first curve 501 representing frequency response of the loudspeaker device without nonlinear control active, and (2) a second curve 502 representing frequency response of the loudspeaker device with nonlinear control active (e.g., implemented using the loudspeaker system 100).

If the loudspeaker device without nonlinear control active is integrated with one or more components of the loudspeaker system 100 (e.g., controller 200 or controller 250), the loudspeaker system 100 can extend roll-off of the frequency response of the loudspeaker device in the low sound frequencies while maintaining low audio distortion and ensuring that displacement of one or more moving components (e.g., diaphragm and/or driver voice coil) of the loudspeaker device is within a safe range of operation. The loudspeaker system 100 provides a system that enables bass extension (i.e., deeper, louder bass) with lower audio distortion, as illustrated by the directional arrows shown in FIG. 11.

Figure 12A:
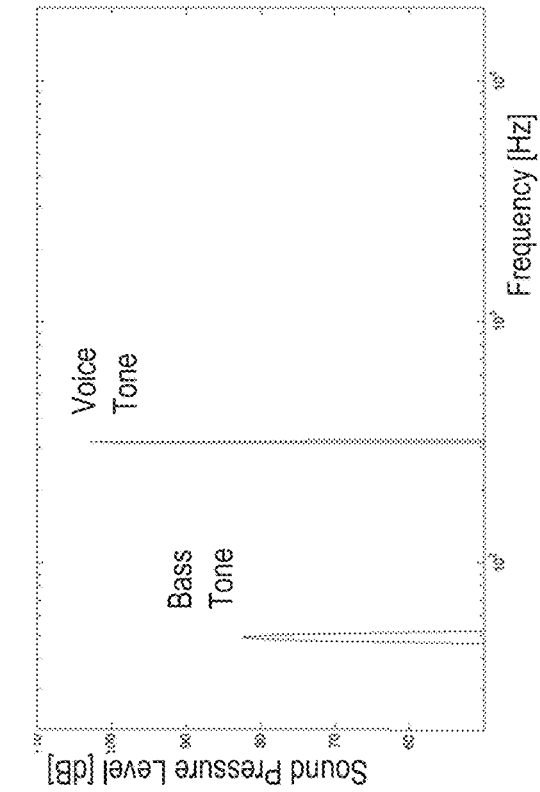
FIG. 12A is an example graph illustrating a frequency spectrum of a loudspeaker device without nonlinear control for correction of audio distortion (i.e., without anti-distortion)

FIG. 12A is an example graph 510 illustrating a frequency spectrum of a loudspeaker device without nonlinear control for correction of audio distortion (i.e., without anti-distortion). A horizontal axis of the graph 510 represents frequency in Hz. A vertical axis of the graph 510 represents sound pressure level in dB. As shown in FIG. 12A, effects of nonlinearities within the loudspeaker device may generate intermodulation products, thereby increasing audio distortion.

Figure 12B:
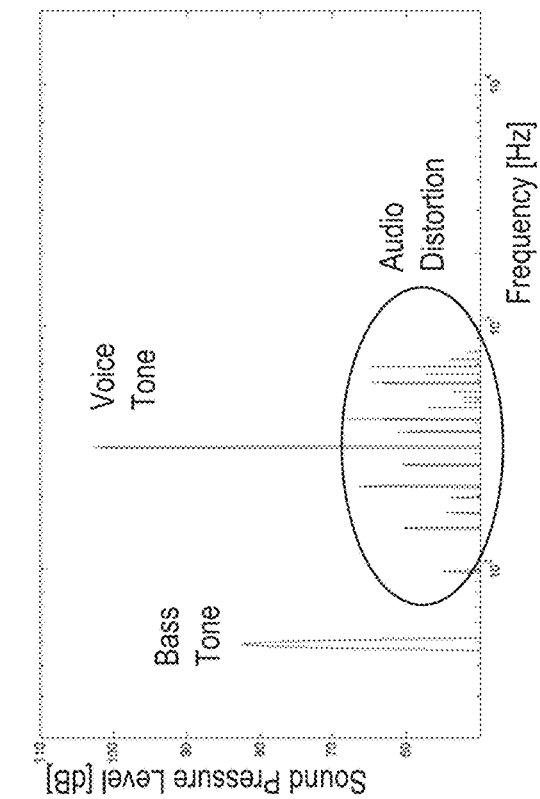
FIG. 12B is an example graph illustrating a frequency spectrum of a loudspeaker device with nonlinear control for correction of audio distortion (i.e., with anti-distortion), in accordance with an embodiment.

FIG. 12B is an example graph 520 illustrating a frequency spectrum of a loudspeaker device with nonlinear control for correction of audio distortion (i.e., with anti-distortion), in accordance with an embodiment. The loudspeaker device may be integrated with one or more components of the loudspeaker system 100 (e.g., controller 200 or controller 250). A horizontal axis of the graph 520 represents frequency in Hz. A vertical axis of the graph 520 represents sound pressure level in dB. Compared to the graph 510 in FIG. 12A, effects of nonlinearities within the loudspeaker device are canceled out as shown in FIG. 12B, thereby reducing intermodulation products and audio distortion.

Figure 13:
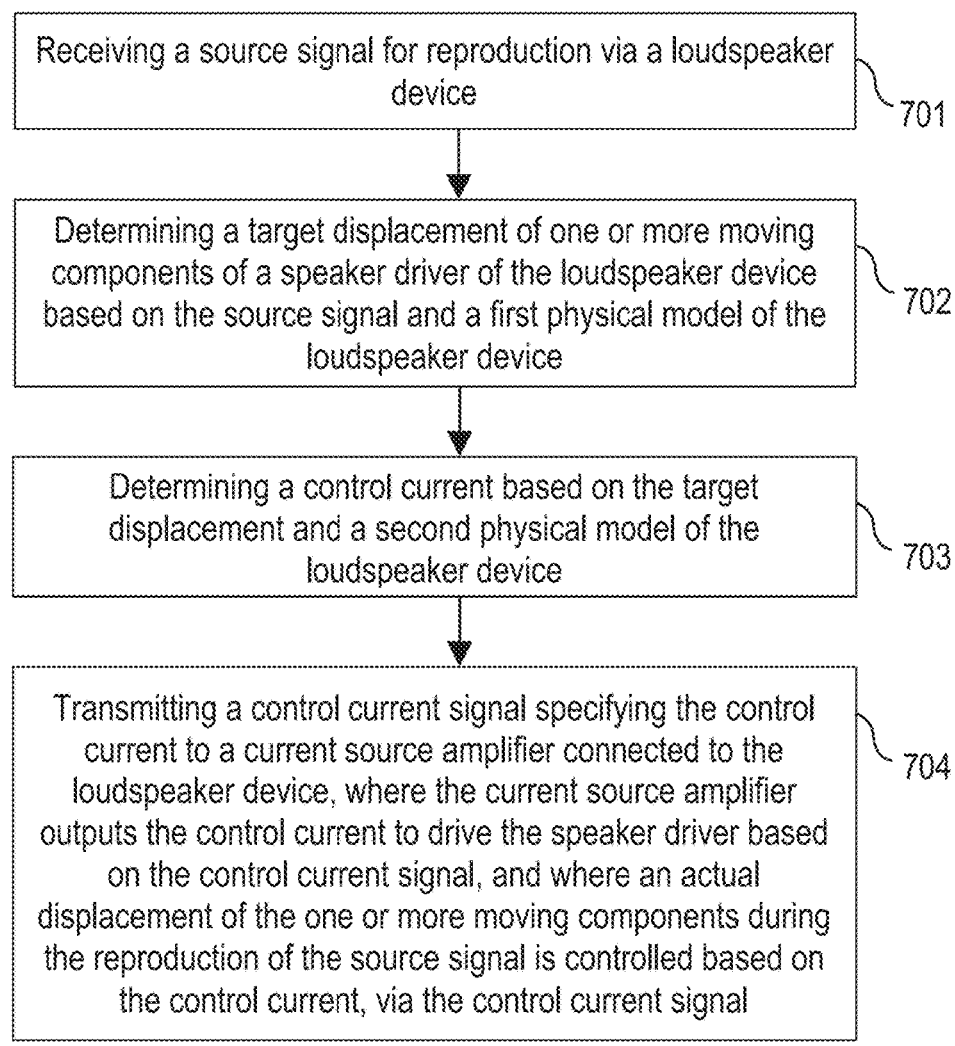
FIG. 13 is an example flowchart of a process for implementing nonlinear control of a loudspeaker device with a current source amplifier, in accordance with an embodiment.

FIG. 13 is an example flowchart of a process 700 for implementing nonlinear control of a loudspeaker device with a current source amplifier, in accordance with an embodiment. Process block 701 includes receiving a source signal for reproduction via a loudspeaker device (e.g., loudspeaker device 60). Process block 702 includes determining a target displacement of one or more moving components (e.g., diaphragm 56 and/or driver voice coil 57) of a speaker driver of the loudspeaker device based on the source signal and a first physical model (e.g., linear state-space model 400 in FIG. 5A or 410 in FIG. 8A) of the loudspeaker device. Process block 703 includes determining a control current based on the target displacement and a second physical model of the loudspeaker device (e.g., nonlinear state-space model in FIG. 8B). Process block 704 includes transmitting a control current signal specifying the control current to a current source amplifier connected to the loudspeaker device, where the current source amplifier outputs the control current to drive the speaker driver based on the control current signal, and where an actual displacement of the one or more moving components during the reproduction of the source signal is controlled based on the control current, via the control current signal.

In one embodiment, one or more components of the loudspeaker system 100, such as the controller 200 or the controller 250, are configured to perform process blocks 701-704.

Figure 14:
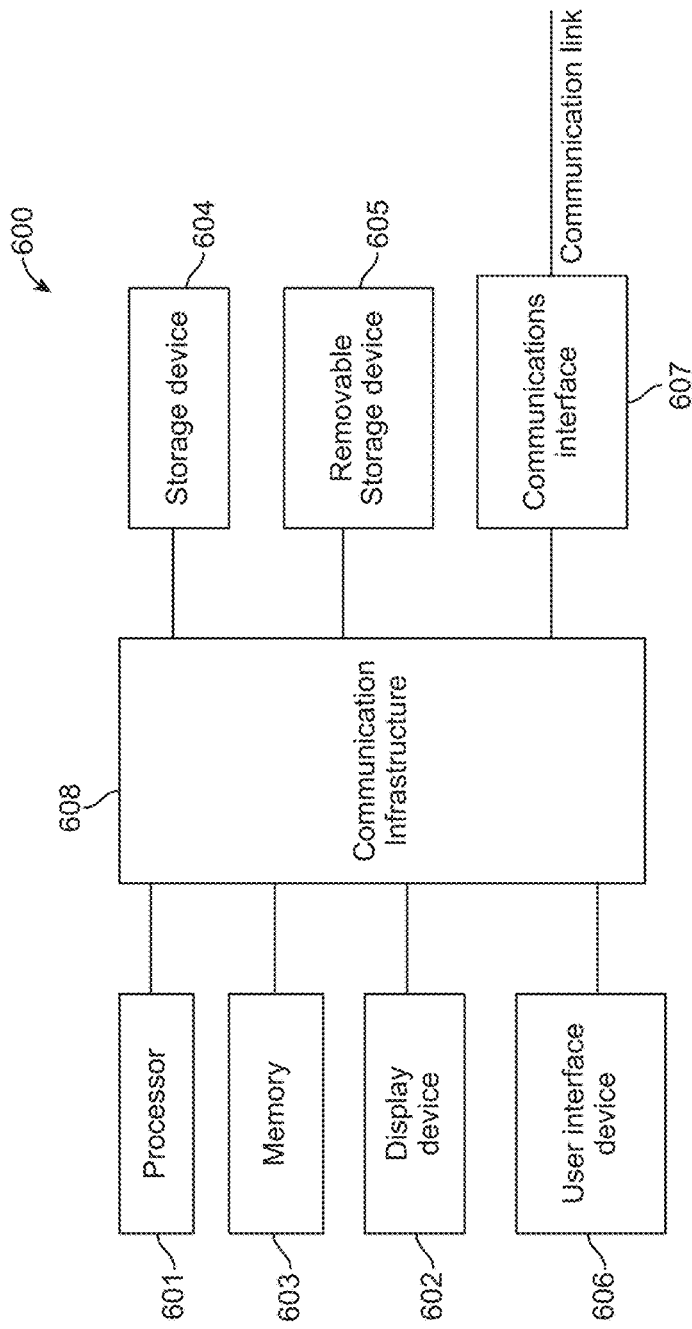
FIG. 14 is a high-level block diagram showing an information processing system comprising a computer system useful for implementing various disclosed embodiments.

FIG. 14 is a high-level block diagram showing an information processing system comprising a computer system 600 useful for implementing various disclosed embodiments. The computer system 600 includes one or more processors 601, and can further include an electronic display device 602 (for displaying video, graphics, text, and other data), a main memory 603 (e.g., random access memory (RAM)), storage device 604 (e.g., hard disk drive), removable storage device 605 (e.g., removable storage drive, removable memory module, a magnetic tape drive, optical disk drive, computer readable medium having stored therein computer software and/or data), user interface device 606 (e.g., keyboard, touch screen, keypad, pointing device), and a communication interface 607 (e.g., modem, a network interface (such as an Ethernet card), a communications port, or a PCMCIA slot and card).

The communication interface 607 allows software and data to be transferred between the computer system 600 and external devices. The nonlinear controller 600 further includes a communications infrastructure 608 (e.g., a communications bus, cross-over bar, or network) to which the aforementioned devices/modules 601 through 607 are connected.

Information transferred via the communications interface 607 may be in the form of signals such as electronic, electromagnetic, optical, or other signals capable of being received by communications interface 607, via a communication link that carries signals and may be implemented using wire or cable, fiber optics, a phone line, a cellular phone link, a radio frequency (RF) link, and/or other communication channels. Computer program instructions representing the block diagrams and/or flowcharts herein may be loaded onto a computer, programmable data processing apparatus, or processing devices to cause a series of operations performed thereon to produce a computer implemented process. In one embodiment, processing instructions for process 700 (FIG. 13) may be stored as program instructions on the memory 603, storage device 604, and/or the removable storage device 605 for execution by the processor 601.

Embodiments have been described with reference to flowchart illustrations and/or block diagrams of methods, apparatus (systems), and computer program products. In some cases, each block of such illustrations/diagrams, or combinations thereof, can be implemented by computer program instructions. The computer program instructions when provided to a processor produce a machine, such that the instructions, which executed via the processor create means for implementing the functions/operations specified in the flowchart and/or block diagram. Each block in the flowchart/block diagrams may represent a hardware and/or software module or logic. In alternative implementations, the functions noted in the blocks may occur out of the order noted in the figures, concurrently, etc.

The terms "computer program medium," "computer usable medium," "computer readable medium," and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Computer program instructions may be stored in a computer readable medium that can direct a computer, other programmable data processing apparatuses, or other devices to function in a particular manner, such that the instructions stored in the computer readable medium produce an article of manufacture including instructions which implement the function/act specified in the flowchart and/or block diagram block(s).

As will be appreciated by one skilled in the art, aspects of the embodiments may be embodied as a system, method or computer program product. Accordingly, aspects of the embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable storage medium (e.g., a non-transitory computer readable storage medium). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of one or more embodiments may be written in any combination of one or more programming languages, including an object oriented programming language such as Java, Smalltalk, C++, or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In some cases, aspects of one or more embodiments are described above with reference to flowchart illustrations and/or block diagrams of methods, apparatuses (systems), and computer program products. In some instances, it will be understood that each block of the flowchart illustrations and/or block diagrams, and combinations of blocks in the flowchart illustrations and/or block diagrams, can be implemented by computer program instructions. These computer program instructions may be provided to a special purpose computer, or other programmable data processing apparatus to produce a machine, such that the instructions, which execute via the processor of the computer or other programmable data processing apparatus, create means for implementing the functions/acts specified in the flowchart and/or block diagram block(s).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block(s).

The computer program instructions may also be loaded onto a computer, other programmable data processing apparatuses, or other devices to cause a series of operational steps to be performed on the computer, other programmable apparatuses, or other devices to produce a computer implemented process such that the instructions which execute on the computer or other programmable apparatuses provide processes for implementing the functions/acts specified in the flowchart and/or block diagram block(s).

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of pre-AIA 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the invention.

Though the embodiments have been described with reference to certain versions thereof; however, other versions are possible. Therefore, the spirit and scope of the appended claims should not be limited to the description of the preferred versions contained herein.

What is claimed is:

1. A system for nonlinear control of a loudspeaker, the system comprising:
   a current source amplifier connected to the loudspeaker; and
   a controller connected to the current source amplifier, wherein the controller is configured to:
      determine a target displacement of a diaphragm of a speaker driver of the loudspeaker based on a source signal for reproduction via the loudspeaker;
      determine a control current based on the target displacement of the diaphragm and a first physical model of the loudspeaker; and
      transmit a control current signal specifying the control current to the current source amplifier, wherein the current source amplifier outputs the control current to drive the speaker driver based on the control current signal, and wherein an actual displacement of the diaphragm during the reproduction of the source signal is controlled based on the control current, via the control current signal.

2. The system of claim 1, wherein the first physical model is a nonlinear model.

3. The system of claim 1, wherein the controller is configured to determine the target displacement of the diaphragm based on a target sound pressure for the system to deliver during the reproduction of the source signal and a second physical model of the loudspeaker.

4. The system of claim 3, wherein the second physical model is a linear model.

5. The system of claim 3, wherein the second physical model is a nonlinear model.

6. The system of claim 1, wherein the controller is further configured to:
monitor a voltage measured at terminals of the speaker driver during the reproduction of the source signal; and
provide updates of one or more loudspeaker model parameters for the loudspeaker based on the measured voltage and the control current.

7. The system of claim 1, wherein the controller is further configured to:
monitor a voltage measured at terminals of the speaker driver during the reproduction of the source signal; and
provide updates of one or more loudspeaker model parameters for the loudspeaker based on the measured voltage and the control current signal.

8. The system of claim 1, wherein the control current limits the actual displacement of the diaphragm within a predetermined range of safe displacement and increases bass output at low frequencies.

9. The system of claim 1, wherein the current source amplifier is configured to drive the speaker driver by amplifying the source signal based on the control current.

10. The system of claim 1, wherein a system transfer function of the system is independent of one or more of the following nonlinear impedances: an electrical resistance of a driver voice coil of the speaker driver, or an inductance of the driver voice coil.

11. The system of claim 1, wherein a mechanical force applied on the diaphragm is based on an actual current output by the current source amplifier, the actual current based on the control current, and the actual current independent of one or more of the following nonlinear impedances: an electrical resistance of a driver voice coil of the speaker driver, or an inductance of the driver voice coil.

12. A method for nonlinear control of a loudspeaker, the method comprising:
determining a target displacement of a diaphragm of a speaker driver of the loudspeaker based on a source signal for reproduction via the loudspeaker;
determining a control current based on the target displacement of the diaphragm and a physical model of the loudspeaker; and
transmitting a control current signal specifying the control current to a current source amplifier connected to the loudspeaker, wherein the current source amplifier outputs the control current to drive the speaker driver based on the control current signal, and wherein an actual displacement of the diaphragm during the reproduction of the source signal is controlled based on the control current, via the control current signal.

13. The method of claim 12, wherein the physical model is a nonlinear model.

14. The method of claim 12, wherein the method further comprises:
monitor a voltage measured at terminals of the speaker driver during the reproduction of the source signal; and
provide updates of one or more loudspeaker model parameters for the loudspeaker based on the measured voltage and one of the control current or the control current signal.

15. The method of claim 12, wherein the control current limits the actual displacement of the diaphragm within a predetermined range of safe displacement and increases bass output at low frequencies.

16. The method of claim 12, wherein a mechanical force applied on the diaphragm is based on an actual current output by the current source amplifier, the actual current based on the control current, and the actual current independent of one or more of the following nonlinear impedances: an electrical resistance of a driver voice coil of the speaker driver, or an inductance of the driver voice coil.

17. A loudspeaker device comprising:
a speaker driver including a diaphragm;
a current source amplifier connected to the speaker driver; and
a controller connected to the current source amplifier, wherein the controller is configured to:
determine a target displacement of a diaphragm of the speaker driver based on a source signal for reproduction via the loudspeaker device;
determine a control current based on the target displacement of the diaphragm and a physical model of the loudspeaker device; and
transmit a control current signal specifying the control current to the current source amplifier, wherein the current source amplifier outputs the control current to drive the speaker driver based on the control current signal, and wherein an actual displacement of the diaphragm during the reproduction of the source signal is controlled based on the control current, via the control current signal.

18. The loudspeaker device of claim 17, wherein the physical model is a nonlinear model.

19. The loudspeaker device of claim 17, wherein the controller is further configured to:
monitor a voltage measured at terminals of the speaker driver during the reproduction of the source signal; and
provide updates of one or more loudspeaker model parameters for the loudspeaker device based on the measured voltage and one of the control current or the control current signal.

20. The loudspeaker device of claim 17, wherein:
the control current limits the actual displacement of the diaphragm within a predetermined range of safe displacement and increases bass output at low frequencies; and
a mechanical force applied on the diaphragm is based on an actual current output by the current source amplifier, the actual current based on the control current, and the actual current independent of one or more of the following nonlinear impedances: an electrical resistance of a driver voice coil of the speaker driver, or an inductance of the driver voice coil.

* * * * *